United States Patent
Furuya et al.

(10) Patent No.: US 9,863,977 B2
(45) Date of Patent: Jan. 9, 2018

(54) METHOD OF CONTACTING SUBSTRATE WITH PROBE CARD

(71) Applicant: Tokyo Electron Limited, Tokyo (JP)

(72) Inventors: Kunihiro Furuya, Nirasaki (JP); Hiroshi Yamada, Nirasaki (JP); Takanori Hyakudomi, Nirasaki (JP); Jun Mochizuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/418,636

(22) PCT Filed: Jul. 18, 2013

(86) PCT No.: PCT/JP2013/070125
§ 371 (c)(1),
(2) Date: Jan. 30, 2015

(87) PCT Pub. No.: WO2014/021176
PCT Pub. Date: Feb. 6, 2014

(65) Prior Publication Data
US 2015/0219687 A1    Aug. 6, 2015

(30) Foreign Application Priority Data
Jul. 31, 2012   (JP) .................................. 2012-169513

(51) Int. Cl.
*G01R 1/073*   (2006.01)
*G01R 31/28*   (2006.01)

(52) U.S. Cl.
CPC ..... *G01R 1/07307* (2013.01); *G01R 31/2887* (2013.01)

(58) Field of Classification Search
CPC .................. G01R 1/07307; G01R 31/2887
(Continued)

(56) References Cited

U.S. PATENT DOCUMENTS 8,587,331 B2 * 11/2013 Berry ................. G01R 31/2891
324/750.16
2010/0149513 A1 * 6/2010 Watson ............... G03F 7/70258
355/72
(Continued)

FOREIGN PATENT DOCUMENTS

CN      104380448 A    2/2015
JP      07-074219 A    3/1995
(Continued)

OTHER PUBLICATIONS

Translation of WO 2012026036 A1, Kiyokawa Toshiyuki, Mar. 2012, JP (Foreign Reference provided by applicant).*

(Continued)

*Primary Examiner* — Patrick Assouad
*Assistant Examiner* — Khristopher Yodichkas
(74) *Attorney, Agent, or Firm* — Pearne & Gordon LLP

(57) ABSTRACT

A method of contacting a substrate with a probe card in a substrate inspection apparatus can inspect electrical characteristics of semiconductor devices on the substrate. A wafer W is transferred to a position facing a probe card 36 while being mounted on a chuck member 22 with a wafer plate 37 therebetween, and electrodes of semiconductor devices on the wafer W are contacted with probes of the probe card 36 by moving the wafer W and the wafer plate 37 toward the probe card 36 through an elevating device 43. Then, the wafer W is overdriven toward the probe card 36 and a contact state between the electrodes of the semiconductor devices and the probes of the probe card 36 is maintained by decompressing a space S between the probe card 36 and the wafer plate 37. Then, the chuck member 22 is separated from the wafer plate 37.

8 Claims, 9 Drawing Sheets

(58) Field of Classification Search
USPC .................................................. 324/756.03
See application file for complete search history.

(56) References Cited

U.S. PATENT DOCUMENTS

2014/0266273 A1* 9/2014 Wang ................. G01R 1/07364
                                                          324/750.24
2015/0130489 A1   5/2015 Yamada

FOREIGN PATENT DOCUMENTS

| JP | 11-238770 A | 8/1999 |
| JP | 2004-140241 A | 5/2004 |
| JP | 2009-276215 A | 11/2009 |
| JP | 2009-295686 A | 12/2009 |
| WO | 2012/026036 A1 | 3/2012 |

OTHER PUBLICATIONS

International Search Report for PCT/JP2013/070125 dated Aug. 20, 2013.

* cited by examiner

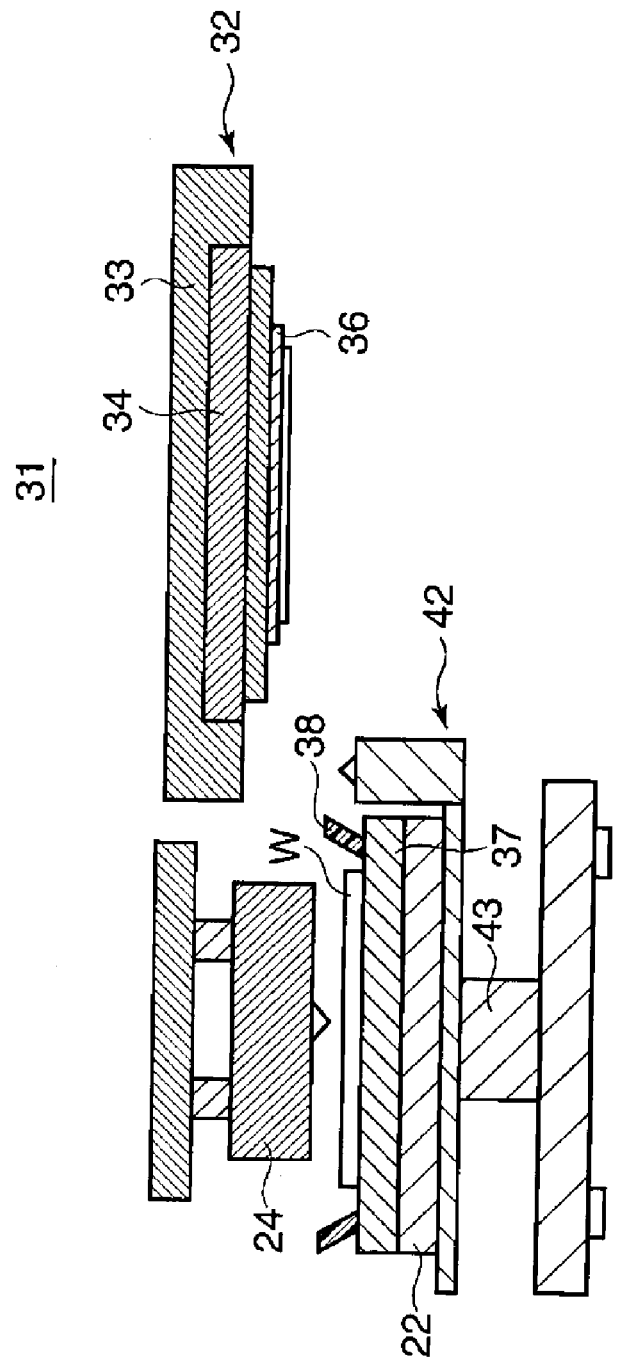

US 9,863,977 B2

METHOD OF CONTACTING SUBSTRATE WITH PROBE CARD

CROSS-REFERENCE TO RELATED APPLICATION

This Application is a U.S. national phase application under 35 U.S.C. §371 of PCT Application No. PCT/JP2013/070125 filed on Jul. 18, 2013, which claims the benefit of Japanese Patent Application No. 2012-169513 filed on Jul. 31, 2012, the entire disclosures of which are incorporated herein by reference.

TECHNICAL FIELD

The embodiments described herein pertain generally to a method of contacting a substrate with a probe card; and, more particularly, to a method of contacting electrodes of semiconductor devices formed on, e.g., a wafer with probes provided on a probe card of a substrate inspection apparatus.

BACKGROUND ART

As a wafer inspection apparatus, for example, there is known a probe apparatus or a burn-in inspection apparatus that inspects electrical characteristics of multiple semiconductor devices formed on a wafer.

FIG. 11 is a cross sectional view illustrating a schematic configuration of a conventional probe apparatus.

As depicted in FIG. 11, a probe apparatus 100 includes a loader chamber 101 that forms a transfer section in which a wafer W is transferred; and an inspection chamber 102 that performs therein an electrical characteristic inspection of a multiple number of semiconductor devices formed on the wafer W. This probe apparatus 100 inspects electrical characteristics of the semiconductor devices by controlling various components within the loader chamber 101 and the inspection chamber 102 under the control of a controller. The inspection chamber 102 includes a mounting table 106 allowed to be moved in X, Y, Z and θ directions while mounting thereon the wafer W loaded from the loader chamber 101 by a transfer arm 103; a pogo frame 109 provided above the mounting table 106; a probe card 108 held by the pogo frame 109; and an alignment device 110 that adjusts relative positions between a multiple number of probes (inspection needles) provided on the probe card 108 and electrodes of a multiple number of semiconductor devices formed on the wafer W in cooperation with the mounting table 106. After the relative position between the wafer W and the probe card 108 is adjusted by the alignment device 110 and the mounting table 106, the individual probes of the probe card 108 are allowed to come into contact with the corresponding electrodes of the wafer W, and the electrical characteristics of the multiple number of the semiconductor devices formed on the wafer W are inspected (see, for example, Patent Document 1).

Patent Document 1: Japanese Patent Laid-open Publication No. 2004-140241

DISCLOSURE OF THE INVENTION

Problems to be Solved by the Invention

In a method of contacting the probe card with the wafer in the conventional wafer inspection apparatus, however, after the mounting table (chuck member) mounting thereon the wafer W is moved to a position corresponding to the probe card held by a wafer inspection interface of the wafer inspection apparatus, the wafer W mounted on the mounting table is lifted upward by an elevating device (lifter), so that the individual electrodes of the semiconductor devices formed on the wafer W are come into contact with the corresponding probes of the probe card. In this contact method, electrical contact resistance at contact portions between the electrodes and the probes is non-uniformed easily. As a result, there is a problem that the electrical characteristics of the semiconductor devices cannot be effectively inspected.

In view of the foregoing problems, example embodiments provide a method of contacting a substrate with a probe card in a substrate inspection apparatus capable of effectively inspecting electrical characteristics of semiconductor devices formed on the substrate.

Means for Solving the Problems

In one example embodiment, a method of contacting a substrate with a probe card provided in a substrate inspection apparatus that inspects electrical characteristics of semiconductor devices formed on the substrate includes a transferring process of transferring the substrate to a position facing the probe card while mounting the substrate on a chuck member with a plate-shaped member therebetween; a contacting process of contacting electrodes of the semiconductor devices formed on the substrate with probes provided on the probe card by moving the substrate, which is transferred in the transferring process, and the plate-shaped member toward the probe card, and then further moving the plate-shaped member and the substrate thereon toward the probe card by a preset amount; a holding process of maintaining a contact state between the electrodes of the semiconductor devices and the probes of the probe card by decompressing a space between the probe card and the plate-shaped member after the contacting process; and a separating process of separating the chuck member from the plate-shaped member after the holding process.

The preset amount in the contacting process may have a range from 10 μm to 150 μm.

A decompression pressure of the space in the holding process may be adjusted to a pressure at which a contact force is allowed to endure a sum of the weights of the substrate and the plate-shaped member and reaction contact forces between the electrodes of the semiconductor devices and the probes of the probe card.

A pressure within the space may be gradually reduced in stages in the holding process.

A seal member configured to airtightly seal the space between the plate-shaped member and the probe card may be provided along a periphery of the plate-shaped member.

The chuck member after the separating process may be moved to a position corresponding to another probe card other than the probe card, and used in inspecting electrical characteristics of semiconductor devices formed on another substrate other than the substrate.

In the holding process, a pressure within the space may be adjusted based on a detection value of a distance detecting sensor configured to detect a distance between a top surface of the chuck member and a mounting surface of the probe card or a distance between the top surface of the chuck member and a bottom surface of the probe card.

The method may further include a decompressing process of increasing a contact pressure between the electrodes of the semiconductor devices and the probers of the probe card by further depressurizing the space after the separating process.

Effect of the Invention

In accordance with the example embodiment, after electrodes of semiconductor devices formed on a substrate are contacted with the probes of a probe card by using a chuck member, the substrate is further moved toward the probe card by a preset amount. Thereafter, by decompressing a space between the probe card and a plate-shaped member, the contact state between the electrodes and the probes is maintained, and, then, the chuck member is separated. Accordingly, a contact surface of the substrate contacted with the probe card is allowed to follow to a virtual plane formed by leading ends of the probes of the probe card. Therefore, it is possible to contact the individual electrodes of the semiconductor devices formed on the substrate with the corresponding probes of the probe card without non-uniformity in electrical contact resistance. Thus, the electrical characteristics of the semiconductor devices formed on the substrate can be inspected effectively.

BRIEF DESCRIPTION OF THE DRAWINGS

FIG. 3 is a cross sectional view showing a relationship between an inspection unit and a transfer device in FIG. 2.

DETAILED DESCRIPTION

In the following, example embodiments will be described in detail, and reference is made to the accompanying drawings, which form a part of the description.

Figure 1:
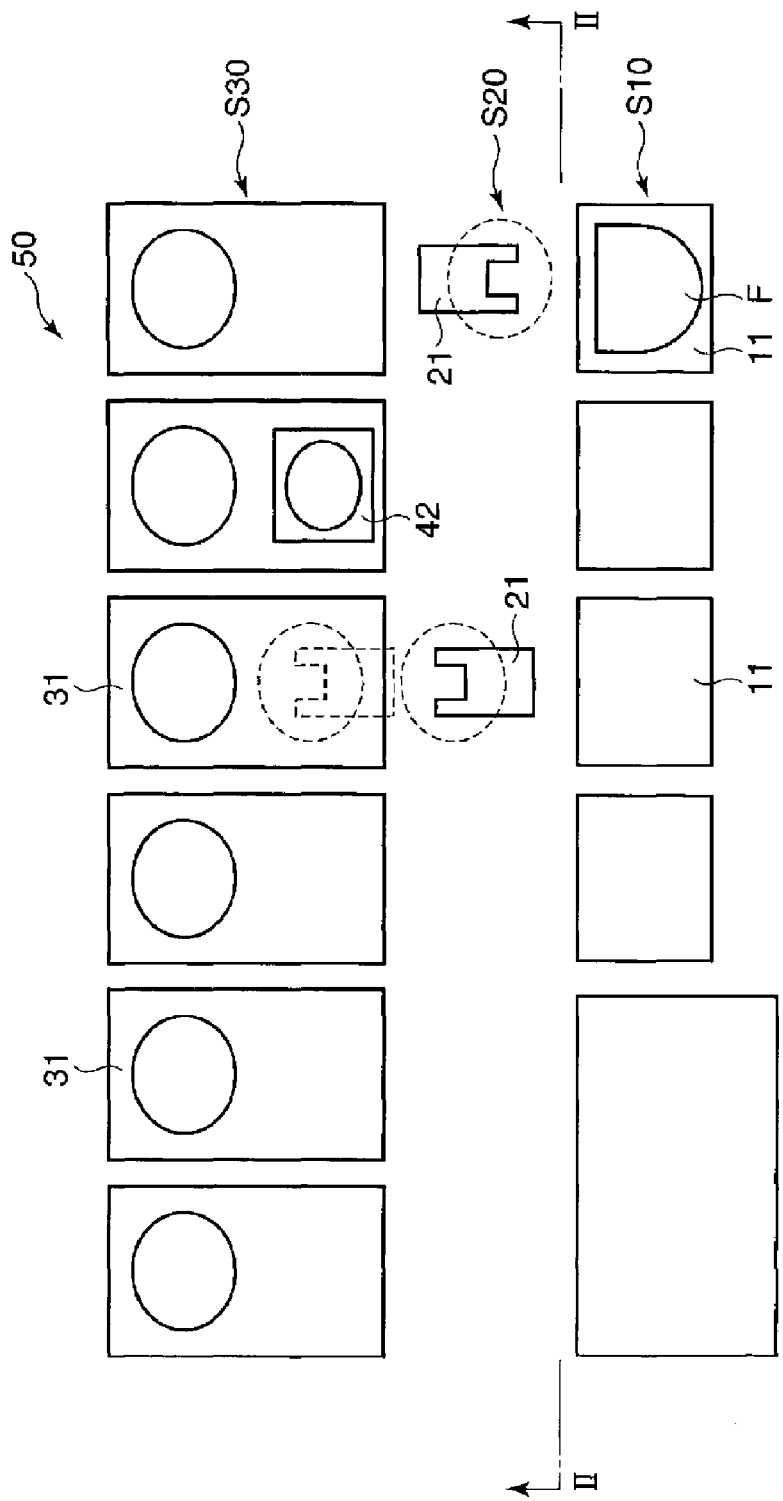
FIG. 1 is a plane view illustrating a schematic configuration of a wafer inspection apparatus in which a method of contacting a substrate with a probe card in accordance with an example embodiment is performed.
Figure 2:
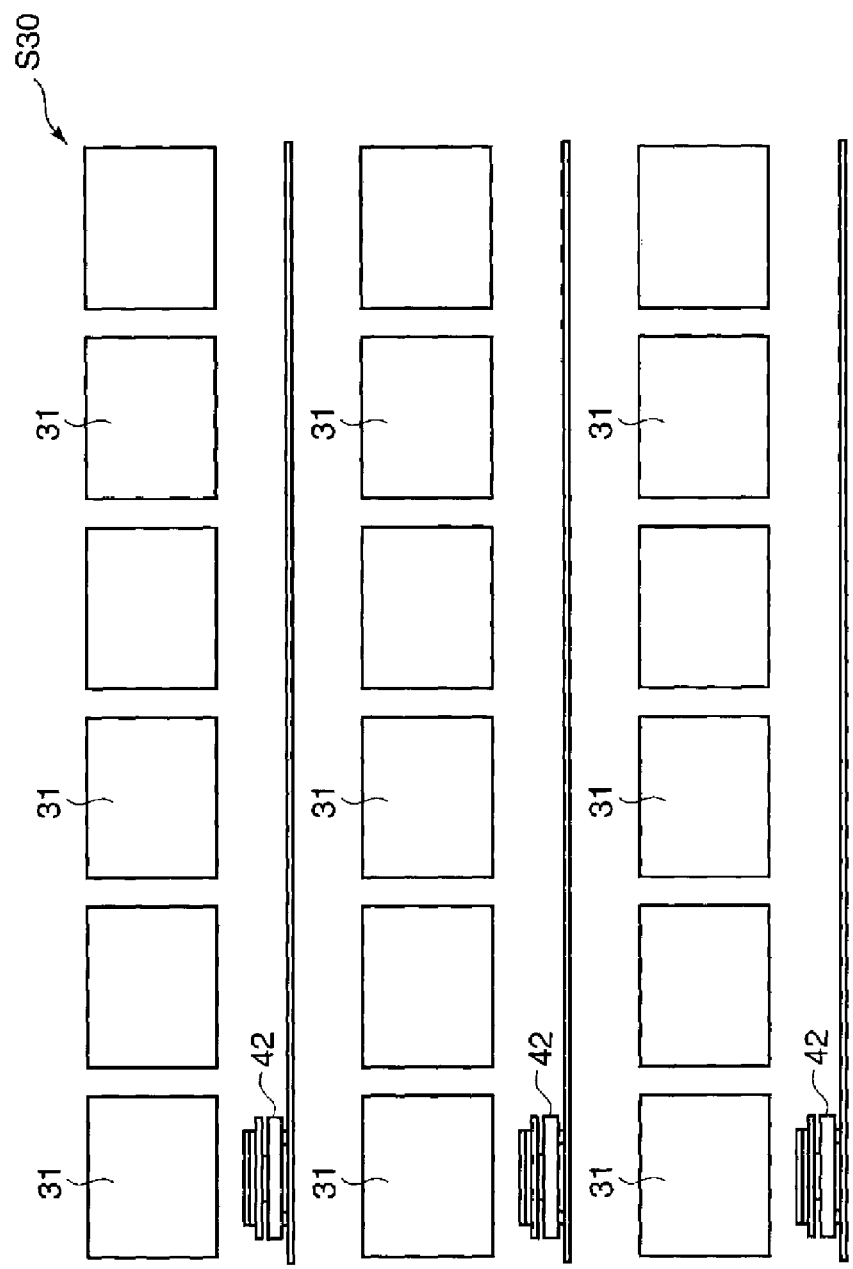
FIG. 2 is a cross sectional view of the wafer inspection apparatus taken along a line II-II of FIG. 1.

FIG. 1 is a plane view illustrating a schematic configuration of a wafer inspection apparatus in which a method of contacting a substrate with a probe card in accordance with an example embodiment is performed. FIG. 2 is a cross sectional view taken along a line II-II of FIG. 1, and FIG. 3 is a cross sectional view showing a relationship between an inspection unit and a transfer device in FIG. 2. This wafer inspection apparatus is a whole-contact type inspection apparatus configured to inspect electrical characteristics of semiconductor devices formed on a wafer by contacting all electrodes of all semiconductor devices with all corresponding probes of a probe card at once.

In FIG. 1, the wafer inspection apparatus 50 mainly includes an inspection section S30 in which electrical characteristics of semiconductor devices formed on a wafer are inspected; a loading/unloading section S10 in which the wafer, a wafer plate, a probe card and so forth are loaded into and unloaded from the wafer inspection apparatus 50; and a transfer section S20 arranged between the loading/unloading section S10 and the inspection section S30.

The loading/unloading section S10 is partitioned into multiple loading/unloading section units 11. A receptacle such as, but not limited to, a FOUP F is provided in each loading/unloading section unit 11. Further, a preliminary position adjustment device (pre-aligner) (not shown) or a needle mark inspection device configured to inspect a needle mark on an inspected wafer (not shown) may be provided adjacent to a part of the loading/unloading section units 11.

A loading/unloading device 21 is provided in the transfer section S20. The loading/unloading device 21 transfers an inspection target wafer, which is received from the FOUP F of the loading/unloading section S10, along the transfer section S20; delivers the inspection target wafer onto, e.g., a wafer plate 37 (see FIG. 3) mounted on a chuck member 22 at an upper portion of a transfer device 42 in the inspection section S30 to be described later; receives an inspected wafer from the wafer plate 37 mounted on the chuck member 22 in the inspection section S30; and transfers the inspected wafer into the loading/unloading section S10.

Multiple inspection units 31 (testers) are provided in the inspection section S30. Adjacent inspection units 31 are not particularly isolated, and the inspection units 31, each of which is equipped with a wafer inspection interface, are arranged in a single continuous space.

Referring to FIG. 2, the inspection section S30 of the wafer inspection apparatus 50 is divided in multiple layers, e.g., three layers in FIG. 2. For example, the same number of inspection units 31 are arranged on each layer, and a position adjustment device, a position alignment camera (both of which are not illustrated) and the transfer device 42 configured to be moved between the inspection units 31 are also provided on each layer.

The transfer device 42 receives the inspection target wafer W, which is transferred to a boundary between the inspection section S30 and the transfer section S20 by the loading/unloading device 21, on the wafer plate (plate-shaped member) 37 mounted on the chuck member 22 at the upper portion of the transfer device 42. Then, as depicted in FIG. 3, the transfer device 42 transfers the wafer W to a position adjustment device 24 configured to be moved between the inspection units 31. The position adjustment device 24 performs position alignment between the wafer plate 37 mounted on the chuck member 22 and the wafer W and, further, position alignment between the wafer W and a probe card 36 provided at a wafer inspection interface 32 of a corresponding inspection unit 31. Subsequently, the transfer device 42 moves the wafer W aligned with the probe card 36 to a position directly under the wafer inspection interface 32. Then, an elevating device 43 moves the wafer W and the wafer plate 37 with the chuck member 22 upwards toward the probe card 36, so that the wafer W is come into contact with the probe card 36. The inspection unit 31 inspects electrical characteristics of a multiple number of semiconductor devices formed on the wafer W in contact with the probe card 36.

Upon the completion of the inspection of the electrical characteristics of the semiconductor devices, the elevating device 43 moves the inspected wafer W and the wafer plate 37 with the chuck member 22 downwards to a position directly under the wafer inspection interface 32. Then, the transfer device 42 transfers the wafer plate 37 and the inspected wafer W thereon to the boundary between the inspection section S30 and the transfer section S20, and then, delivers the inspected wafer W to the loading/unloading device 21. The loading/unloading device 21 that has received the inspected wafer W from the transfer device 42 then delivers the inspected wafer W to the needle mark inspection device (not shown) provided in a certain part of the loading/unloading section S10. The needle mark inspection device inspects whether a needle mark (probe contact trace) is formed on the electrode of each semiconductor device of the inspected wafer. Then, the loading/unloading device 21 loads the inspected wafer W into the FOUP F of the loading/unloading section S10.

In this case, a first wafer W unloaded from a first FOUP F is position-adjusted and then loaded into a first inspection unit 31 through the cooperation of the loading/unloading device 21 and the transfer device 42. Meanwhile, while the electrical characteristics of semiconductor devices formed on the first wafer W are being inspected in the first inspection unit 31, a second wafer W unloaded from a second FOUP F may be position-adjusted and then be loaded into a second inspection unit 31 as well. Further, while the electrical characteristics of the semiconductor devices formed on the first wafer W are being inspected in the first inspection unit 31, a third wafer W inspected in a third inspection unit may be unloaded from the third inspection unit and then loaded into a third FOUP F through the cooperation of the loading/unloading device 21 and the transfer device 42. That is, the loading/unloading device 21 and the transfer device 42 cooperate to transfer and load/unload wafers W between a multiple number of FOUPs F and the multiple number of inspection units 31 in sequence, and the multiple number of inspection units 31 inspect the electrical characteristics of the semiconductor devices formed on these individual wafers W in sequence.

Now, a method of contacting a substrate with a probe card by using the wafer inspection apparatus having the above-described configuration will be elaborated in accordance with an example embodiment.

FIG. 4A to FIG. 7B are diagrams illustrating processes of the method of contacting the substrate with the probe card in the wafer inspection apparatus of FIG. 1.

Figure 4A:
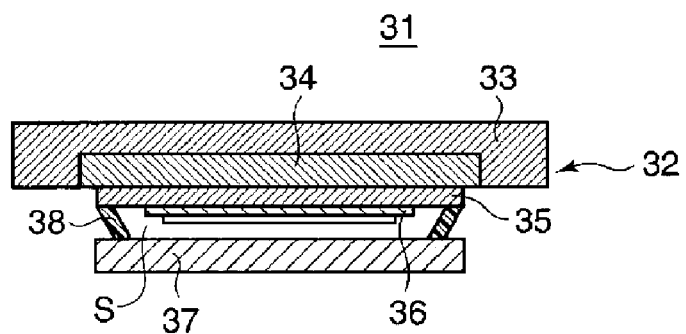
FIG. 4A to FIG. 4C are diagrams illustrating a process of the method of contacting the substrate with the probe card in accordance with the example embodiment.
Figure 4B:
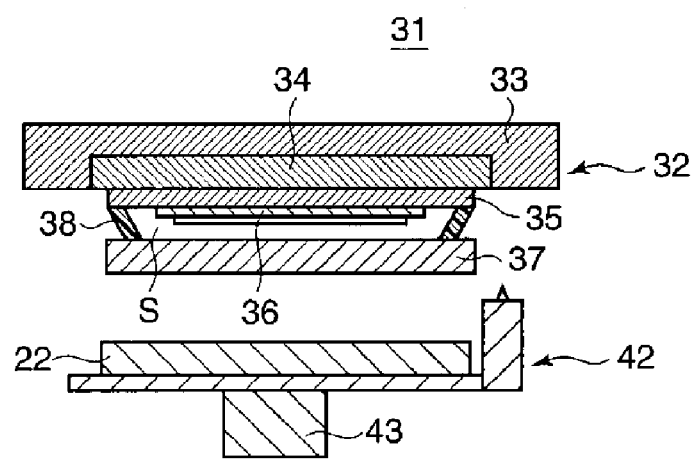
Figure 4C:
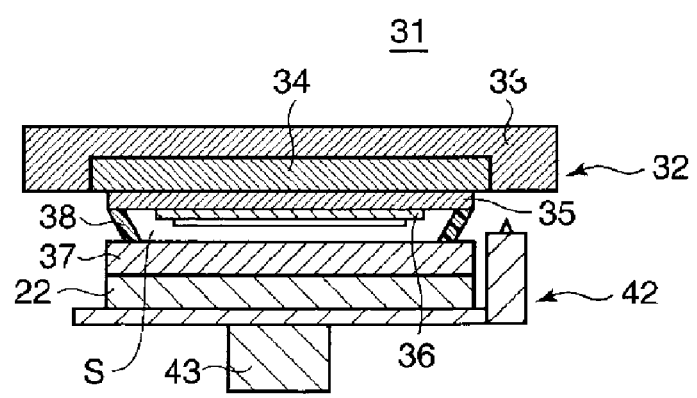

Referring to FIG. 4A to FIG. 4C, the inspection unit 31 is returned back to an initial state (FIG. 4A). The inspection unit 31 is equipped with the wafer inspection interface 32 which includes a head plate 33 and a pogo frame 34 forming a lower surface of the head plate 33. The probe card 36 is supported at a bottom surface of the pogo frame 34 with a contact plate 35 therebetween. Here, the initial state of the inspection unit 31 refers to a state in which the wafer plate 37 configured to mount a wafer thereon is placed to face a bottom surface of the probe card 36 and is attracted to and held by the wafer inspection interface 32 by decompressing a space S surrounded by the wafer plate 37, a seal member (O-ring) 38 provided around the wafer plate 37 and the contact plate 35.

At this time, a pressure within the space S is adjusted to, for example, 2 kPa to 10 kPa. Further, in the present example embodiment, the space S will be referred to as a space between the probe card 36 and the wafer plate 37, hereinafter. The O-ring 38 airtightly seals the space S between the probe card 36 and the wafer plate 37 against the outside.

Figure 5A:
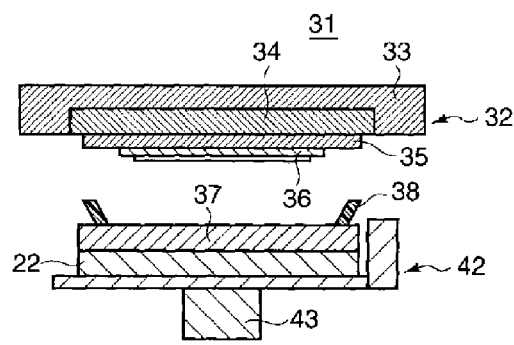
FIG. 5A to FIG. 5C are diagrams illustrating a process of the method of contacting the substrate with the probe card in accordance with the example embodiment.
Figure 5B:
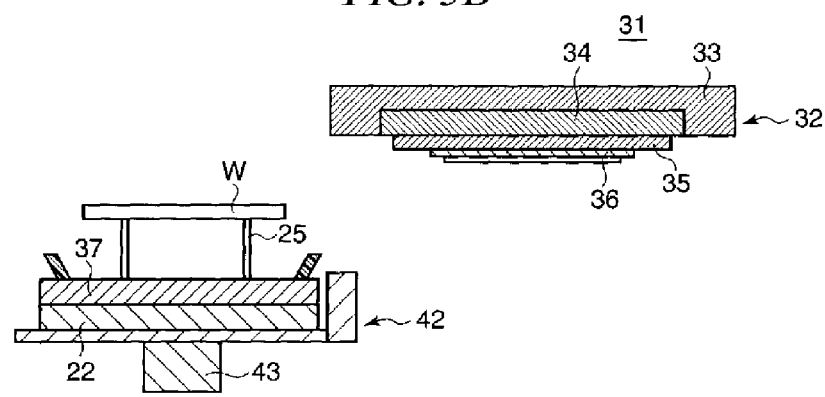

Subsequently, the transfer device 42 is moved to a position under the inspection unit 31 in the initial state (FIG. 4B), and by driving the elevating device 43 of the transfer device 42, the chuck member 22 at the upper portion of the transfer device 42 is contacted with a bottom surface of the wafer plate 37 (FIG. 4C). In this state, the decompressed state of the space S is released. After the decompressed state of the space S is released, the elevating device 43 is driven and the transfer device 42 is moved down while mounting the wafer plate 37 on the chuck member 22 (FIG. 5A). At this time, the wafer plate 37 is attracted to and held on the chuck member 22. In the initial state, the wafer plate 37 is suspended from the wafer inspection interface 32 by a non-illustrated hook-shaped supporting member configured to suppress the wafer plate 37 from falling down. When the transfer device 42 is moved down while mounting the wafer plate 37 on the chuck member 22, the wafer plate 37 is first lifted upwards slightly and moved horizontally to avoid the engagement with the hook-shaped supporting member, and then moved down through a region where the hook-shaped supporting member is not provided.

Figure 5C:
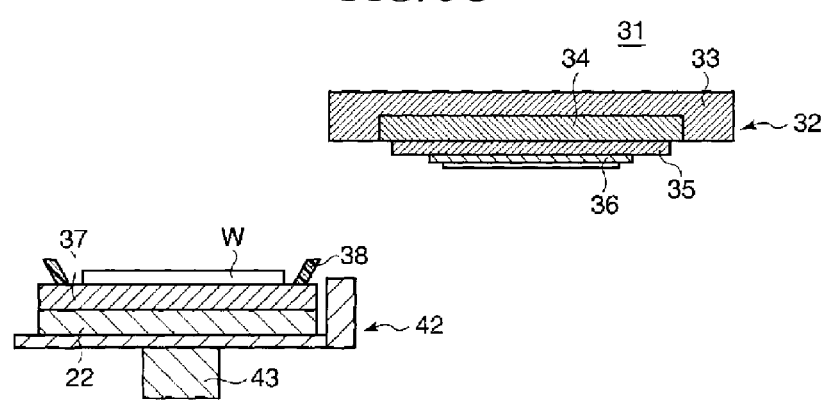

Then, the transfer device 42 transfers the wafer plate 37 mounted on the chuck member 22 to a boundary between the inspection section S30 and the transfer section S20. The loading/unloading device 21 of the transfer section 20 receives an inspection target wafer W from the FOUP F in the loading/unloading section S10. Then, the loading/unloading device 21 transfers the inspection target wafer W to the boundary between the transfer section S20 and the inspection section S30, and then, delivers the wafer W onto the wafer plate 37 mounted on the chuck member 22 at the upper portion of the transfer device 42. At this time, the wafer plate 37 receives the wafer W by using supporting pins 25 configured to be protruded from or retracted into a top surface of the wafer plate 37 (FIG. 5B), and then, attracts and holds the received wafer W onto the wafer plate 37 (FIG. 5C).

Figure 6A:
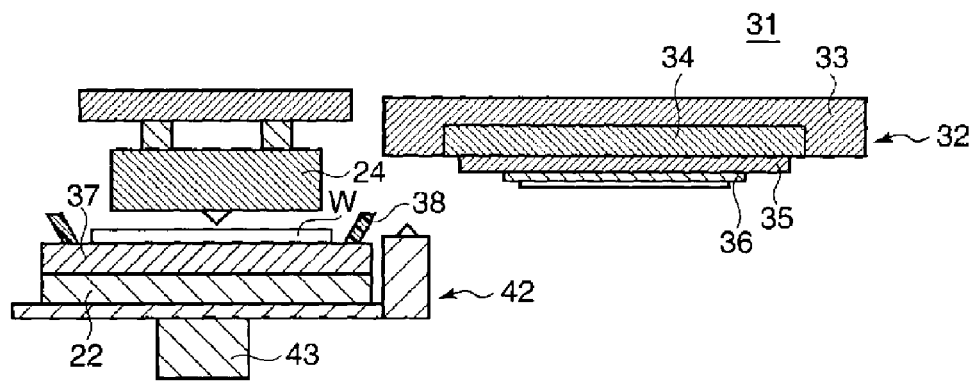
FIG. 6A to FIG. 6C are diagrams illustrating a process of the method of contacting the substrate with the probe card in accordance with the example embodiment.

Thereafter, the transfer device 42 with the wafer W thereon is moved to the position adjustment device 24 adjacent to the inspection unit 31 having the wafer inspection interface 32, and the wafer W is position-aligned with the wafer plate 37 (FIG. 6A). At this time, the position alignment of the wafer W with the wafer plate 37 is performed by moving the transfer device 42 in X, Y, Z and θ directions while monitoring the movement by a monitoring camera.

Further, the position adjustment device 24 is configured to be movable within the inspection section S30. The position adjustment device 24 is moved to a position adjacent to the corresponding inspection unit 31 and performs the aforementioned position adjustment. Then, the position adjustment device 24 is moved to a preset standby position or to an inspection unit 31 other than the corresponding inspection unit 31.

Figure 6B:
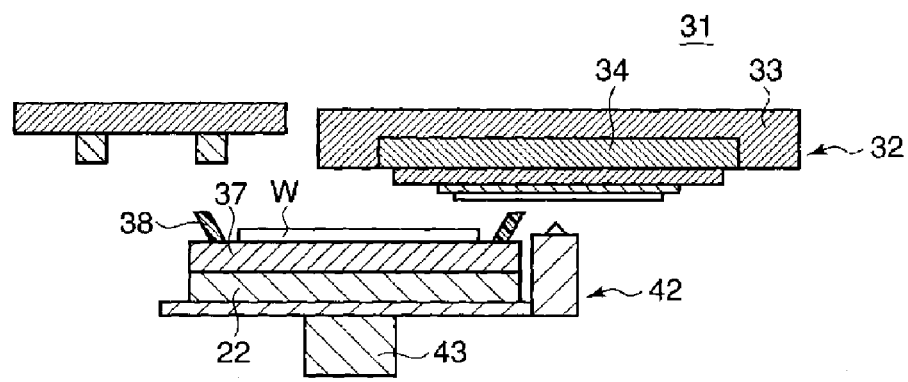

Subsequently, the transfer device 42 transfers the wafer W, which is mounted on the chuck member 22 with the wafer plate 37 therebetween, to a position below the wafer inspection interface 32 of the inspection unit 31, and performs the position alignment of the wafer plate 37 and the wafer W with the probe card 36 (FIG. 6B).

Figure 6C:
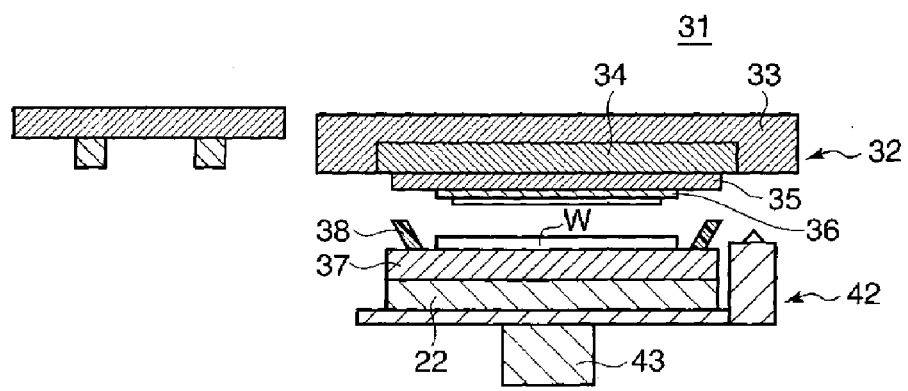
Figure 7A:
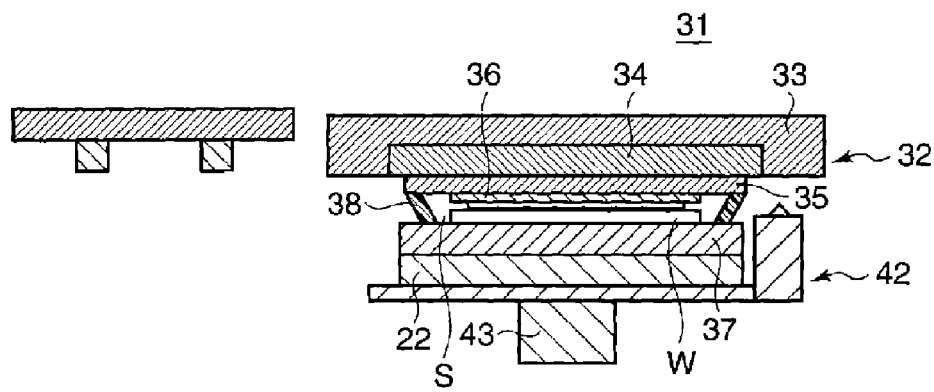
FIG. 7A and FIG. 7B are diagrams illustrating a process of the method of contacting the substrate with the probe card in accordance with the example embodiment.

Thereafter, the transfer device 42 is moved to a position directly under the wafer inspection interface 32 while mounting thereon the wafer W aligned with the probe card 36 (FIG. 6C). Then, by driving the elevating device 43, the wafer W and the wafer plate 37 are lifted upwards along with the chuck member 22, so that a multiple number of electrodes of semiconductor devices formed on the wafer W are contacted with a multiple number of probes provided on the probe card 36. Thereafter, by further elevating the wafer W in a preset amount, the electrodes of the semiconductor devices formed on the wafer W are allowed to come into more secure contact with the probes of the probe card 36 (FIG. 7A).

In this case, a moving amount by which the wafer W is further moved toward the probe card 36 (hereinafter, this movement will be referred to as "overdrive") is, for example, 10 μm to 150 μm.

Figure 7B:
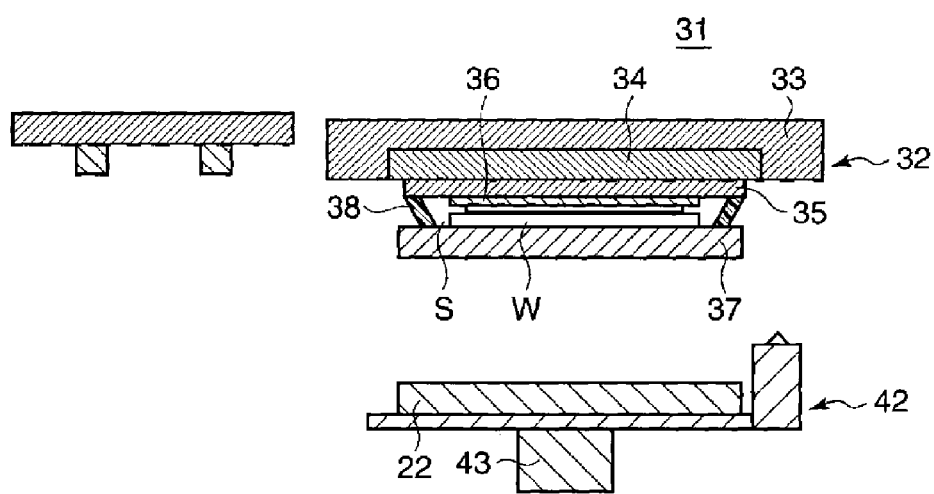

Afterwards, the space S between the probe card 36 and the wafer plate 37 is decompressed by a non-illustrated decompression device, and, then, the chuck member 22 is separated from the wafer plate 37 to be moved downwards (FIG. 7B). At this time, a pressure within the space S is adjusted to, e.g., 0.2 kPa to 20 kPa at which it is possible to obtain a contact force which can endure the sum of the weights of the wafer W and the wafer plate 37 and reaction forces against contact forces between the multiple number of electrodes of the semiconductor devices and the multiple number of probes of the probe card 36. Furthermore, an optimum decompression pressure of the space S may be varied depending on processing conditions, for example, the number of the probes provided on the probe card 36, or the like.

As stated above, after the wafer W is contacted with the probe card 36 held by the wafer inspection interface 32 in the inspection unit 31, the inspection unit 31 inspects electrical characteristics of the semiconductor devices on the wafer W.

In accordance with the present example embodiment, after the wafer W mounted on the chuck member 22 with the wafer plate 37 therebetween is contacted with the probe card 36, the wafer W is overdriven by a preset amount, and the firm contact state between the wafer W and the probe card 36 is maintained by decompressing the space S between the probe card 36 and the wafer plate 37. Accordingly, the multiple number of electrodes of the semiconductor devices and the multiple number of probes of the probe card 36 can be securely contacted with each other, so that electrical contact resistance at contact portions therebetween can be reduced. Further, non-uniformity in the electrical contact resistance at the contact portions between the electrodes and the probes can be reduced, so that inspection accuracy for the electrical characteristics of the semiconductor devices can be improved.

Figure 8:
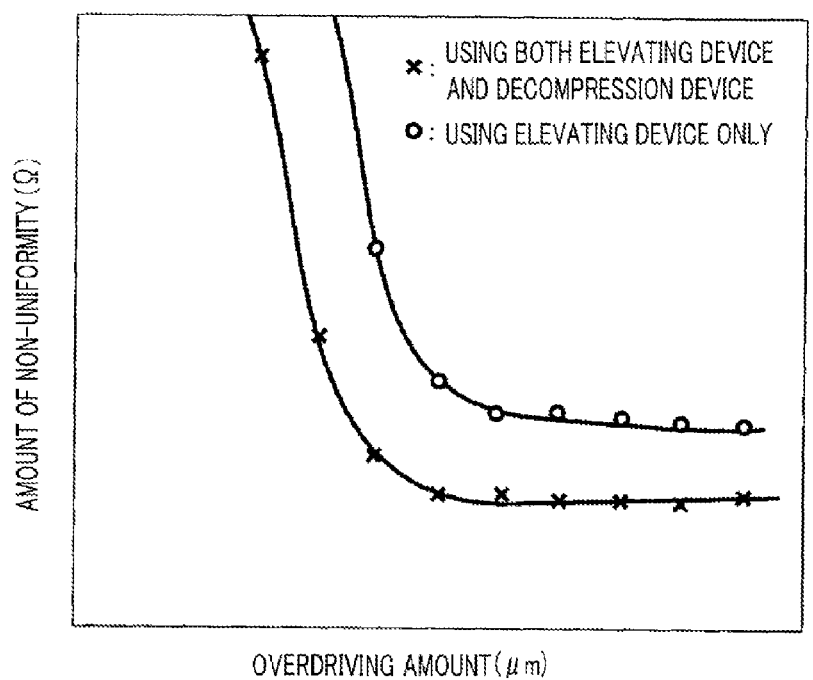
FIG. 8 is a diagram showing a relationship between an overdriving amount and non-uniformity of electrical contact resistances at contact portions between the electrodes of semiconductor devices and the probes after a contacting process in the method of contacting the substrate with the probe card in accordance with the example embodiment, as compared to a case where the same contacting process is performed by using only a driving device.

FIG. 8 is a diagram showing a relationship between an overdriving amount and non-uniformity in the electrical contact resistance at contact portions between the electrode of the semiconductor devices and the probes in the method of contacting the substrate with the probe card after the contacting process in accordance with the present example embodiment, as compared to a case where the same contacting process is performed by using only a driving device.

As can be seen from FIG. 8, in the present example embodiment in which both the elevating device and a decompression device (holding process) are used, the electrical contact resistance can be rapidly reduced and stabilized into a state in which the non-uniformity in the electrical contact resistance is reduced, as compared to the case where the same process is performed by using only the elevating device. The reason for this is deemed to be as follows. Since the chuck member 22 is separated from the wafer plate 37 in the separating process after the holding process, stiffness of the structure including the wafer W and the wafer plate 37 is reduced, so that a contact surface of the wafer W with the probe card 36 is deformed to follow a virtual plane formed at leading ends of the probes of the probe card 36. Therefore, for example, even in case that the lengths of the probes of the probe card 36 are irregular or when the probe card 36 and the wafer W are not parallel to each other, the leading ends of the probes and the electrodes of the semiconductor devices are still allowed to come into secure contact with each other.

Further, in accordance with the example embodiment, since the electrodes of the semiconductor devices formed on the wafer W and the probes provided on the probe card 36 are contacted with each other in the overdriven state before decompressing the space S, contact positions between the electrodes and the probes are not deviated, so that any product defects resulting from the deviation of needle positions can be suppressed. For comparison, in the method of decompressing the space S prior to contacting the electrodes of the semiconductor devices with the probes of the probe card and then contacting the electrodes with the probes, the contact positions between the electrodes and the probes are easily deviated due to an insufficient contact force of the electrodes with the probes. As a result, a needle mark size may be increased, which may cause the defective product.

Further, in accordance with the present example embodiment, since the position adjustment device 24 and the position adjustment camera are provided to be moved in correspondence to each of the inspection units 31, the position adjustment between the wafer W and the probe card 36 can be implemented in each of the inspection units 31 in real time, and the position adjustment device 24 and the position adjustment camera do not interfere with the movement of the transfer device 42.

In the present example embodiment, after the separating process, the chuck member 22 is moved by the transfer device 42 to a position corresponding to a probe card other than the probe card 36 and is used in inspecting electrical characteristics of semiconductor devices formed on another wafer other than the subject wafer W.

In the present example embodiment, the loading/unloading device 21 and the transfer device 42 may be used not only in transferring the wafer W but also in transferring the probe card 36 and the other components.

In the holding process of the present example embodiment, it may be desirable to gradually decompress the space S in stages. Through this way of decompression, it is possible to suppress excessive depressurization of the space S, so that degradation of product quality as a result of the increase of the needle mark size can be avoided.

Figure 9:
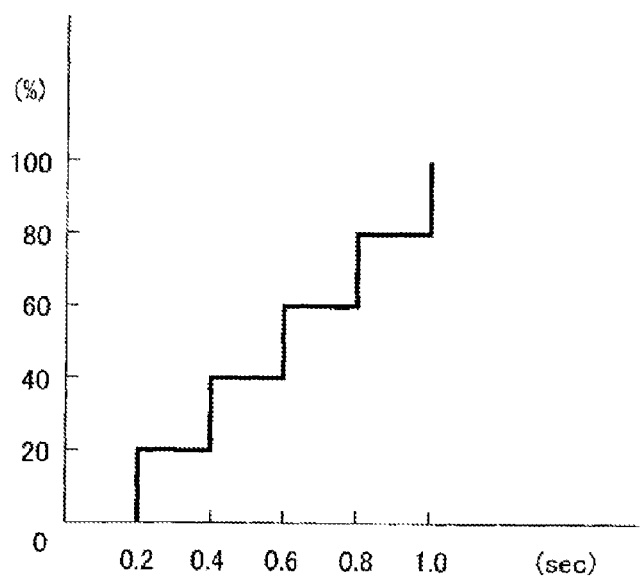
FIG. 9 is a diagram illustrating a decompression method of decompressing a space between the probe card and a wafer plate.

FIG. 9 shows a decompression method of decompressing the space S between the probe card and the wafer plate.

FIG. 9 depicts a method of decompressing the space S. In this method, if a pressure in the final depressurization state in the holding process is set to be 100%, a decompression amount is regularly and gradually increased in stages, e.g., by 20%. Through this method, the space S can be decompressed without having an adverse effect on the contact portions between the electrodes of the semiconductor devices on the wafer W and the probes of the probe card 36.

In FIG. 9, the total decompression time is set to be 1 sec, and the unit time for varying the decompression amount is set to be 200 msec, but the total decompression time and the decompression unit time are not limited thereto and may be varied depending on the processing conditions. In addition, although the decompression pressure is increased regularly in stages in the present example embodiment, it may be increased irregularly in stages.

The method of contacting the substrate with the probe card in accordance with the example embodiment may be applicable to a probe apparatus including a single chuck member (substrate transfer device) facing a single wafer inspection interface within a single inspection chamber, and also applied to a substrate inspection apparatus, which includes a multiple number of inspection units and a substrate transfer device configured to transfer substrates among the multiple number of the inspection units or between the multiple number of inspection units and a multiple number of loading/unloading section units, as depicted in FIG. 1.

In the present example embodiment, there may be provided a distance detecting sensor configured to detect a distance from a top surface (chuck top) 22a of the chuck member 22 to a bottom surface 35a of the contact plate 35 as a mounting surface on which the probe card 36 is mounted, or a distance from the chuck top 22a to the bottom surface (virtual plane formed at the leading ends of the probes) of the probe card 36.

That is, the contact state between the electrodes of the semiconductor devices formed on the wafer W and the probes provided on the probe card 36 is maintained by decompressing the space S between the probe card 36 and the wafer plate 37 in the holding process after the contacting process. In this case, if the pressure within the space S varies in the holding process, the positions of the wafer plate 37 and the chuck top 22a, which forms the top surface of the chuck member 22 in contact with the bottom surface of the wafer plate 37, may be shifted. If the chuck top 22a is shifted, the contact state between the electrodes of the semiconductor devices on the wafer W mounted on the chuck member 22 and the probes provided on the probe card 36, namely, an overload amount at the contact portions may varies, so that the stable contact state cannot be maintained.

Accordingly, the distance detecting sensor configured to detect a distance L1 from the chuck top 22a to the bottom surface 35a of the contact plate 35 or a distance L2 from the chuck top 22a to the bottom surface of the probe card 36 (hereinafter, simply referred to as "height of the chuck top 22a") is provided and the space S is depressurized in the holding process while the detection data of the distance detecting sensor are fed back. Thus, it is possible to avoid the shift of the chuck top 22a caused by the pressure variation within the space S, and, also possible to avoid the variation of the overload amount at the respective contact portions between each of the electrodes of the semiconductor devices formed on the wafer W and the probes provided on the probe card 36.

Figure 10:
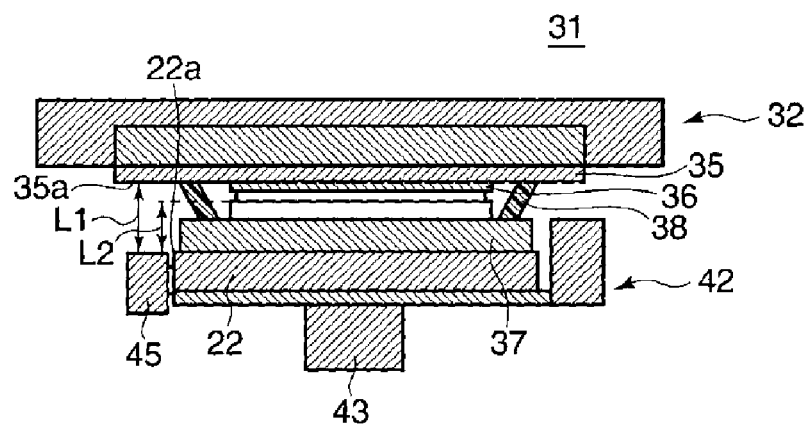
FIG. 10 is a cross sectional view illustrating an inspection unit of a substrate inspection apparatus in which a distance detecting sensor is provided at a chuck member.
Figure 11:
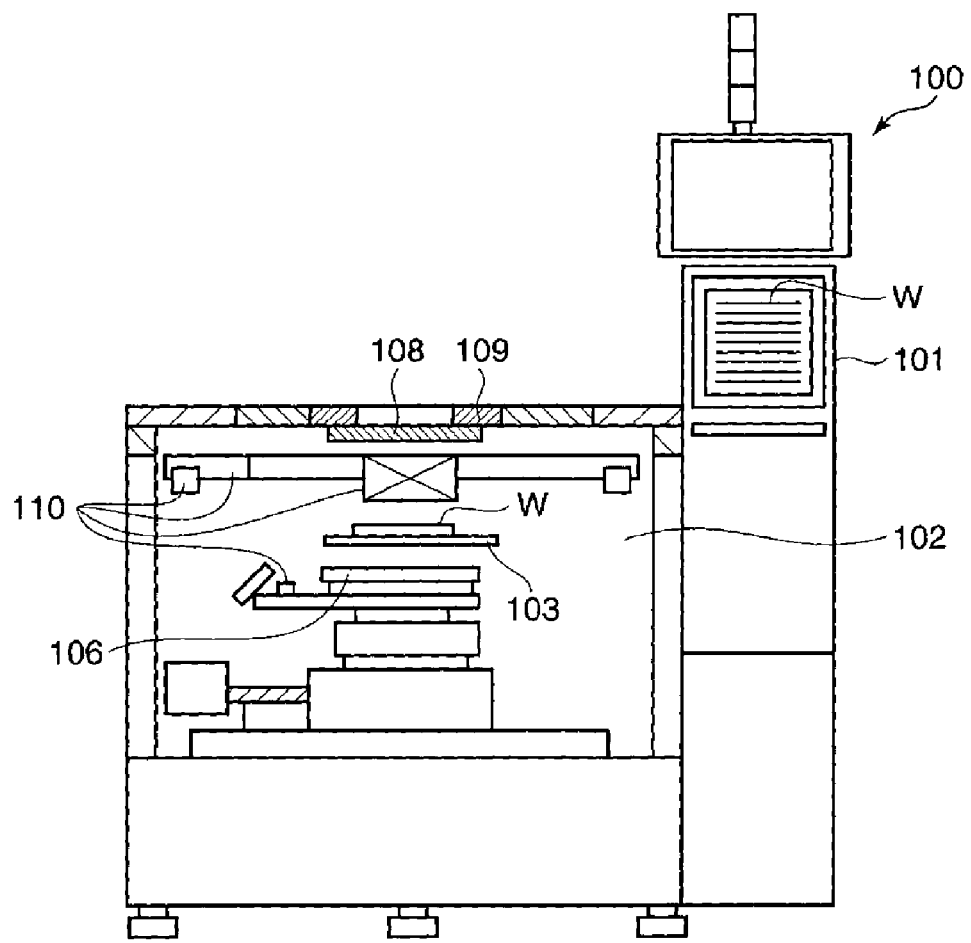
FIG. 11 is a cross sectional view illustrating a schematic configuration of a conventional probe apparatus.

FIG. 10 is a cross sectional view showing an inspection unit of a substrate inspection apparatus, in which a distance detecting sensor 45 is provided at the chuck member 22.

In FIG. 10, the distance detecting sensor 45 configured to detect the height of the chuck top 22a is provided at an end portion of the chuck member 22.

In the inspection unit having the above-described configuration, in the holding process performed after the contacting process in which the multiple number of electrodes of the semiconductor devices on the wafer W are contacted with the multiple number of the probes provided on the probe card 36 and then the wafer W is moved upwards by a preset amount to contact the multiple number of electrodes of the semiconductor devices on the wafer W with the multiple number of probes of the probe card 36 with a preset overdriving amount, the space S is decompressed while the data indicating the height of the chuck top 22a detected by the distance detecting sensor 45 are fed back.

In this case, if the pressure within the space S varies due to changes in the atmosphere temperature of the substrate inspection apparatus, leakage of the space S, or the like, for example, the height of the chuck top 22a may be shifted, so that a preset overdriving amount may not be maintained. Accordingly, by detecting the height of the chuck top 22a through the distance detecting sensor 45 and decompressing the space S while the detection data of the height of the chuck top 22a are fed back to the decompression device for the space S, the shift of the chuck top 22a and the overdriving amount change are avoided, so that the stable contact state can be maintained. Accordingly, even when the pressure within the space S is likely to vary due to the change in the atmosphere temperature of the like, the variation of the pressure can be suppressed, so that the preset overdriving amount at the contact portions between the electrodes of the semiconductor devices and the probes of the probe card 36 can be maintained stably. Therefore, it is possible to further improve the accuracy of the electrical characteristic inspection with respect to the electrical characteristics of the semiconductor devices.

In the example embodiments, after the separating process of separating the wafer plate 37 from the chuck member 22, the contact pressure between the multiple electrodes of the semiconductor devices on the wafer W and the multiple probes of the probe card 36 can be further increased by further depressurizing the space S. Accordingly, by securely contacting the multiple electrodes of the semiconductor devices and the multiple probes of the probe card 36 with each other, it is possible to further reduce the electrical contact resistance at the contact portions therebetween.

Although the present disclosure has been described with respect to the example embodiments, the example embodiments are not intended to be limiting.

This international application claims priority to Japanese Patent Application No. 2012-169513, filed on Jul. 31, 2012, which application is hereby incorporated by reference in its entirety.

EXPLANATION OF REFERENCE NUMERALS

W: Wafer
S: Space
21: Loading/unloading device
22: Chuck member
24: Position adjustment device
31: Inspection unit
32: Wafer inspection interface
36: Probe card
37: Wafer plate
38: O-ring
42: Transfer device
43: Elevating device (Lifter)
45: Distance detecting sensor
50: Wafer inspection apparatus

We claim:
1. A method of contacting a substrate with a probe card provided in a substrate inspection apparatus that inspects electrical characteristics of semiconductor devices formed on the substrate, the method comprising:

a transferring process of transferring the substrate to a position facing the probe card while mounting the substrate on a chuck member with a plate-shaped member therebetween;

a contacting process of contacting electrodes of the semiconductor devices formed on the substrate with probes provided on the probe card by moving the substrate, which is transferred in the transferring process, and the plate-shaped member toward the probe card by driving an elevating device;

after the contacting process, an overdriving process of further moving the plate-shaped member and the substrate thereon toward the probe card by a preset amount by driving the elevating device to form an overdriven state between the electrodes of the semiconductor devices and the probes;

after the overdriving process, a holding process of maintaining a contact state between the electrodes of the semiconductor devices and the probes of the probe card by decompressing a space between the probe card and the plate-shaped member; and a separating process of separating the chuck member from the plate-shaped member after the holding process, wherein the contacting process is performed before decompressing the space between the probe card and the plate-shaped member is started.

2. The method of claim 1, wherein the preset amount in the contacting process has a range from 10 μm to 150 μm.

3. The method of claim 1, wherein a decompression pressure of the space in the holding process is adjusted to a pressure at which a contact force is allowed to endure a sum of the weights of the substrate and the plate-shaped member and reaction contact forces between the electrodes of the semiconductor devices and the probes of the probe card.

4. The method of claim 3, wherein a pressure within the space is gradually reduced in stages in the holding process.

5. The method of claim 1, wherein a seal member configured to airtightly seal the space between the plate-shaped member and the probe card is provided along a periphery of the plate-shaped member.

6. The method of claim 1, wherein the chuck member after the separating process is moved to a position corresponding to another probe card other than the probe card, and used in inspecting electrical characteristics of semiconductor devices formed on another substrate other than the substrate.

7. The method of claim 1, wherein, in the holding process, a pressure within the space is adjusted based on a detection value of a distance detecting sensor configured to detect a distance between a top surface of the chuck member and a mounting surface of the probe card or a distance between the top surface of the chuck member and a bottom surface of the probe card.

8. The method of claim 1, further comprising: a decompressing process of increasing a contact pressure between the electrodes of the semiconductor devices and the probers of the probe card by further depressurizing the space after the separating process.

* * * * *